(12) United States Patent
Kasai et al.

(10) Patent No.: US 8,368,025 B2
(45) Date of Patent: Feb. 5, 2013

(54) RADIATION IMAGE CONVERSION PANEL AND PRODUCTION METHOD THEREOF

(75) Inventors: Shigetami Kasai, Hino (JP); Hiroshi Isa, Hino (JP); Makoto Iijima, Isehara (JP); Yasushi Nagata, Kodaira (JP)

(73) Assignee: Konica Minolta Medical & Graphic, Inc., Hino-shi (JP)

( * ) Notice: Subject to any disclaimer, the term of this patent is extended or adjusted under 35 U.S.C. 154(b) by 207 days.

(21) Appl. No.: 12/934,064

(22) PCT Filed: Feb. 20, 2009

(86) PCT No.: PCT/JP2009/053010
§ 371 (c)(1),
(2), (4) Date: Sep. 22, 2010

(87) PCT Pub. No.: WO2010/023970
PCT Pub. Date: Mar. 4, 2010

(65) Prior Publication Data
US 2011/0017913 A1    Jan. 27, 2011

(30) Foreign Application Priority Data
Aug. 28, 2008  (JP) ................. 2008-219503

(51) Int. Cl.
*G01T 1/20* (2006.01)
(52) U.S. Cl. ............ 250/361 R; 250/370.11; 250/483.1; 250/484.4; 250/581; 250/582
(58) Field of Classification Search .......... 250/361 R, 250/370.11, 483.1, 484.4, 581, 582
See application file for complete search history.

(56) References Cited

U.S. PATENT DOCUMENTS

| | | | | |
|---|---|---|---|---|
| 4,039,840 | A * | 8/1977 | Shimiya et al. | 250/486.1 |
| 4,820,926 | A * | 4/1989 | Popma et al. | 250/486.1 |
| 5,811,932 | A * | 9/1998 | Colditz et al. | 313/524 |
| 6,707,050 | B2 | 3/2004 | Hosoi | |
| 7,893,405 | B2 | 2/2011 | Nagano et al. | |
| 2002/0074502 | A1* | 6/2002 | Takabayashi et al. | 250/368 |
| 2003/0047697 | A1 | 3/2003 | Iwabuchi et al. | |
| 2005/0056795 | A1 | 3/2005 | Shibuya et al. | |

(Continued)

FOREIGN PATENT DOCUMENTS

| JP | 54-35060 B2 | 10/1973 |
|---|---|---|
| JP | 63-215987 A | 9/1988 |

(Continued)

OTHER PUBLICATIONS

U.S. Appl. No. 12/934,061, filed Sep. 22, 2010.

(Continued)

*Primary Examiner* — David Porta
*Assistant Examiner* — Djura Malevic
(74) *Attorney, Agent, or Firm* — Holtz, Holtz, Goodman & Chick, PC

(57) ABSTRACT

Disclosed are a radiation image conversion panel which has achieved a radiation image with enhanced sharpness and improved moisture resistance and shock resistance, and a production method thereof. The radiation image conversion panel comprises, on a support, a phosphor layer comprising phosphor columnar crystals, each composed mainly of cesium iodide (CsI) and formed by a process of gas phase deposition, wherein a coefficient of variation of crystal diameter of the phosphor columnar crystals is not more than 50% and a coefficient of variation of phosphor filling factor of the phosphor layer is not more than 20%.

8 Claims, 1 Drawing Sheet

U.S. PATENT DOCUMENTS

| | | | |
|---|---|---|---|
| 2005/0061992 A1* | 3/2005 | Kasai et al. | 250/484.4 |
| 2006/0054830 A1 | 3/2006 | Oyaizu et al. | |
| 2007/0051896 A1* | 3/2007 | Okada et al. | 250/370.11 |
| 2007/0075270 A1 | 4/2007 | Leblans et al. | |
| 2008/0035852 A1* | 2/2008 | Nagata et al. | 250/370.11 |
| 2008/0083877 A1 | 4/2008 | Nomura et al. | |
| 2008/0093558 A1* | 4/2008 | Shoji et al. | 250/361 R |
| 2008/0099687 A1* | 5/2008 | Shoji et al. | 250/368 |
| 2008/0099694 A1* | 5/2008 | Shoji et al. | 250/483.1 |
| 2008/0217550 A1* | 9/2008 | Shoji et al. | 250/370.11 |
| 2009/0001287 A1 | 1/2009 | Leblans et al. | |
| 2009/0261274 A1* | 10/2009 | Sakurai et al. | 250/484.4 |
| 2010/0092769 A1* | 4/2010 | Shoji et al. | 428/337 |
| 2010/0116992 A1* | 5/2010 | Kudo et al. | 250/361 R |
| 2010/0314547 A1* | 12/2010 | Kudo et al. | 250/368 |
| 2011/0017912 A1 | 1/2011 | Goto et al. | |

FOREIGN PATENT DOCUMENTS

| | | |
|---|---|---|
| JP | 06-100856 A | 4/1994 |
| JP | 2000-284053 A | 10/2000 |
| JP | 2002-116258 A | 4/2002 |
| JP | 2002-214397 A | 7/2002 |
| JP | 2003-050298 A | 2/2003 |
| JP | 2004-071434 A | 3/2004 |
| JP | 2005-091140 A | 4/2005 |
| JP | 2005-091143 A | 4/2005 |
| JP | 2005-098717 A | 4/2005 |
| JP | 2006-058099 A | 3/2006 |
| JP | 2007-041008 A | 2/2007 |
| JP | 2007-101541 A | 4/2007 |
| JP | 2008-051793 A | 3/2008 |
| WO | WO 2004/029657 A1 | 4/2004 |

OTHER PUBLICATIONS

Japanese Office Action dated Oct. 30, 2012 (and English translation thereof) in counterpart Japanese Application No. 2010-526582.

* cited by examiner

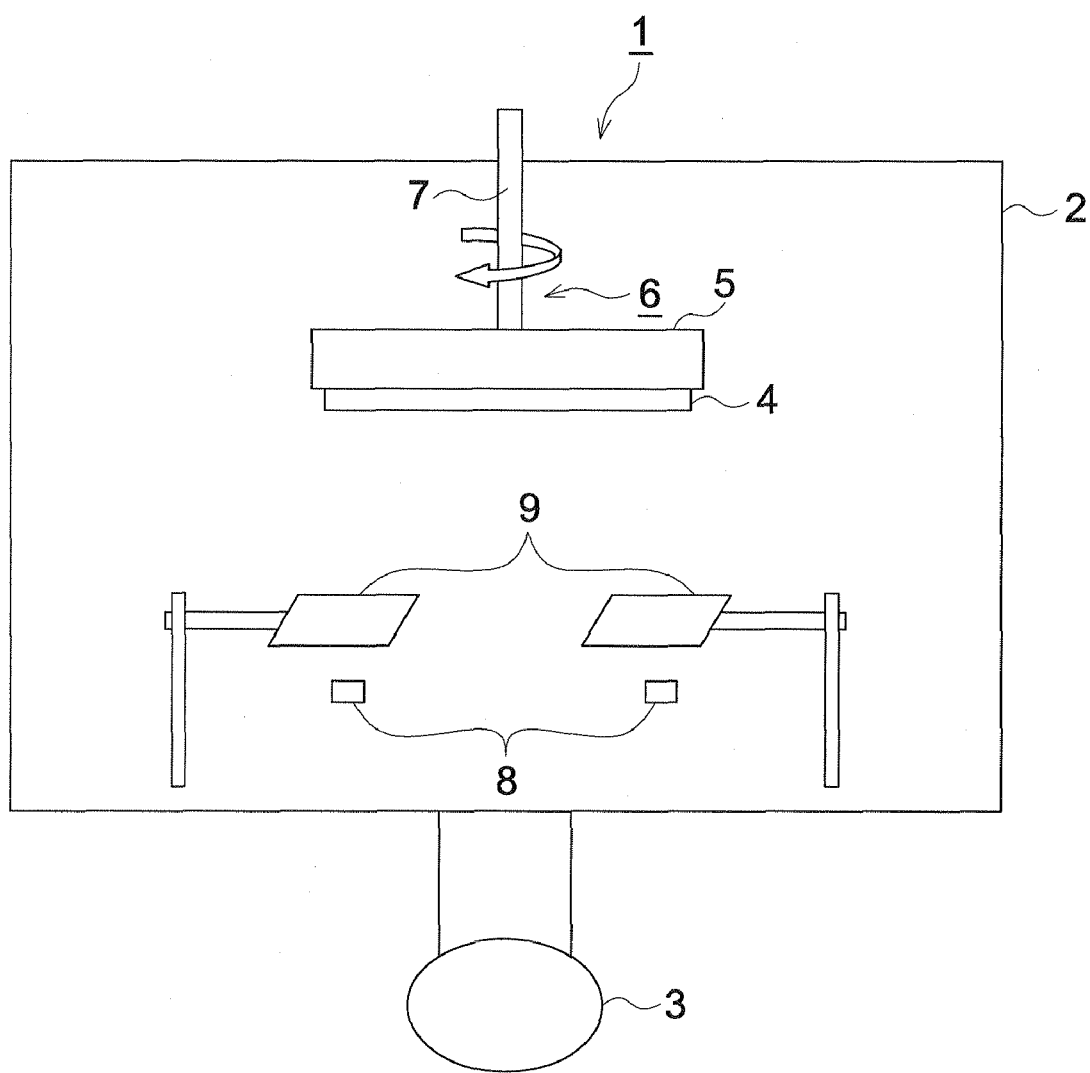

RADIATION IMAGE CONVERSION PANEL AND PRODUCTION METHOD THEREOF

This application is the United States national phase application of International Application PCT/JP2009/053010 filed Feb. 20, 2009.

TECHNICAL FIELD

The present invention relates to a radiation image conversion panel enabling to obtain a radiation image with enhanced sharpness and achieving improved moisture resistance and shock resistance, and a production method thereof.

TECHNICAL BACKGROUND

There have been broadly employed radiographic images such as X-ray images for diagnosis of the conditions of patients on the wards. Specifically, radiographic images using an intensifying-screen/film system have achieved enhancement of speed and image quality over its long history and are still used on the scene of medical treatment as an imaging system having high reliability and superior cost performance in combination. However, these image data are so-called analog image data, in which free image processing or instantaneous image transfer cannot be realized.

Recently, there appeared digital system radiographic image detection apparatuses, as typified by a computed radiography (also denoted simply as CR) and a flat panel detector (also denoted simply as FPD). In these apparatuses, digital radiographic images are obtained directly and can be displayed on an image display apparatus such as a cathode tube or liquid crystal panels, which renders it unnecessary to form images on photographic film. Accordingly, digital system radiographic image detection apparatuses have resulted in reduced necessities of image formation by a silver salt photographic system and leading to drastic improvement in convenience for diagnosis in hospitals or medical clinics.

The computed radiography (CR) as one of the digital technologies for radiographic imaging has been accepted mainly at medical sites. However, image sharpness is insufficient and spatial resolution is also insufficient, which have not yet reached the image quality level of the conventional screen/film system. Further, there appeared, as a digital X-ray imaging technology, an X-ray flat panel detector (FPD) using a thin film transistor (TFT), as described in, for example, the article "Amorphous Semiconductor Usher in Digital X-ray Imaging" described in Physics Today, November, 1997, page 24 and also in the article "Development of a High Resolution, Active Matrix, Flat-Panel Imager with Enhanced Fill Factor" described in SPIE, vol. 32, page 2 (1997).

To convert radiation to visible light is employed a scintillator panel made of an X-ray phosphor which is emissive for radiation. The use of a scintillator panel exhibiting enhanced emission efficiency is necessary for enhancement of the SN ratio in radiography at a relatively low dose. Generally, the emission efficiency of a scintillator panel depends of the phosphor layer thickness and X-ray absorbance of the phosphor. A thicker phosphor layer causes more scattering of emission within the phosphor layer, leading to deteriorated sharpness. Accordingly, necessary sharpness for desired image quality level necessarily determines the layer thickness.

Specifically, cesium iodide (CsI) exhibits a relatively high conversion rate of X-rays to visible light. Further, a columnar crystal structure of the phosphor can readily be formed through vapor deposition and its light guide effect inhibits scattering of emitted light within the crystal, enabling an increase of the phosphor layer thickness (as described in, for example, patent document 1).

However, the use of cesium iodide (CsI) alone results in reduced emission efficiency. For example, there was disclosed a technique for use as an X-ray phosphor in which a mixture of cesium iodide (CO) and sodium iodide (NaI) at any mixing ratio was deposited on a substrate to form sodium-activated cesium iodide (CsI:Na), which was further subjected to annealing as a post-treatment to achieve enhanced visible-conversion efficiency (as described in, for example, patent document 2).

However, a scintillator (also referred to as a phosphor layer) based on cesium iodide (CsI) exhibits deliquescence and suffered a disadvantage of characteristics being deteriorated with aging. Accordingly, to prevent such deterioration with aging, there was proposed formation of a moisture-proof protective layer provided on the surface of the scintillator (phosphor layer). For instance, there is known a technique in which the upper portion and the side portion of a scintillator layer (corresponding to a phosphor layer of the present invention) and the circumferential portion of the scintillator layer on a substrate are covered with a poly-p-xylylene resin (as described in, for example, patent document 1).

Recently, in a flat panel type radiation detector (FDP, or also referred to as a radiation image conversion panel) employing cesium iodide (CsI), a larger flat panel or a portable cassette type panel have been required and levels of requirements for moisture resistance or shock resistance have become severe, compared to computed radiography (CR) employing a photostimulable phosphor, so that the prior art, as described above was not able to satisfy the required levels.

In order to achieve enhancements of moisture resistance or shock resistance of a flat panel type radiation detector (FDP), there has been attempted providing a protective layer, sealing with a protective layer or using a buffering agent between a panel and an enclosure, which has not satisfied a required level.

Patent document 1: JP 63-215987A
Patent document 2: JP 54-035060B
Patent document 3: JP 2000-284053A

DISCLOSURE OF THE INVENTION

Problems to be Solved

The present invention has come into being in view of the foregoing problems or circumstances and it is an object of the invention to provide a radiation image conversion panel which can realize a radiation image with enhanced sharpness and has achieved improved moisture resistance and shock resistance, and a production method of the same.

Means for Solving the Problem

As a result of focusing on solving the foregoing problems, it was found by the inventors of this application that improved moisture resistance and shock resistance were unexpectedly achieved by allowing both of a coefficient of variation of crystal diameter of columnar crystals in a cesium iodide phosphor layer and a coefficient of variation of filling factors of crystals in the phosphor layer to fall within specific ranges, whereby the present invention has been achieved.

Thus, the foregoing problems related to the invention have been solved by the following:

1. A radiation image conversion panel comprising, on a support, a phosphor layer comprising phosphor columnar crystals which are each composed mainly of cesium iodide (CsI) and formed by a process of gas phase deposition, wherein a coefficient of variation of crystal diameters of the phosphor columnar crystals is not more than 50% and a coefficient of variation of phosphor filling factors of the phosphor layer is not more than 20%.

2. The radiation image conversion panel as described in 1, wherein the phosphor columnar crystals are formed of raw materials of cesium iodide (CsI) and an additive containing a thallium (Tl) compound.

3. The radiation image conversion panel as described in 1 or 2, wherein the phosphor columnar crystals comprise a layer not containing thallium in their bottom portions.

4. The radiation image conversion panel as described in any of 1 to 3, wherein the radiation image conversion panel is provided with a scintillator panel comprising the phosphor layer on the support and a light receiving element (planar light receiving element) in which plural light receiving picture elements are two-dimensionally arranged.

5. A production method of a radiation image conversion panel as described in any of 1 to 4, by using a vapor deposition device having an evaporation source and a support rotation mechanism provided within a vacuum vessel, a phosphor layer is formed by a gas phase deposition process comprising placing a support onto the support rotation mechanism and evaporating a phosphor material with rotating the support.

Effect of the Invention

According to the present invention, there can be provided a radiation image conversion panel which can obtain a radiation image with enhanced sharpness, has achieved improved moisture resistance and shock resistance and comprises, on a support, a phosphor layer containing phosphor columnar crystals formed by a process of gas phase deposition.

The reason for achieving improvements in moisture resistance and shock resistance is not clear but it is supposed that when the coefficient of variation of the crystal diameters of the phosphor columnar crystals is more than 50% and the coefficient of variation of the phosphor filling factors of the phosphor layer is more than 20%, phosphor particles are locally fused, resulting in disorder in the columnar crystal structure or generating voids in the phosphor layer and areas in the vicinity thereof are easily damaged by local humidity or shock, leading to deterioration in humidity resistance or shock resistance.

BRIEF DESCRIPTION OF THE DRAWING

FIG. 1 depicts a schematic depiction of a production device of a scintillator panel.
1: Production device of scintillator panel
2: Vacuum vessel
3: Vacuum pump
4: Support
5: Support holder
6: Support rotation mechanism
7: Support rotation shaft
8: Evaporation source
9: Shutter

PREFERRED EMBODIMENTS OF THE INVENTION

The radiation image conversion panel of the invention is featured in that the radiation image conversion panel comprises, on a support, a phosphor layer comprising phosphor columnar crystals which are composed mainly of cesium iodide (CsI) and formed by a process of gas phase deposition, in which the coefficient of variation of the crystal diameter of the phosphor columnar crystals is not more than 50% and the coefficient of variation of the phosphor the filling factor of the phosphor layer is not more than 20%. Such a feature is a technical characteristic common in the foregoing 1-5.

In one preferred embodiment of the invention, the phosphor columnar crystals are made from raw materials of cesium iodide and an additive containing thallium to achieve the effects of the invention. It is also preferred that the phosphor columnar crystals include a layer containing no thallium in their bottom portions.

In one preferred embodiment of the invention, the radiation image conversion panel is provided with a scintillator panel comprising the phosphor layer on the support and a light receiving element (which is also referred to as a planar light receiving element) having light receiving elements arranged in a two-dimensional form.

In the production method of the radiation image conversion panel of the invention, a vapor deposition device provided with an evaporation source and a support rotation mechanism within a vacuum vessel is employed and a phosphor layer is formed by a gas phase deposition process comprising placing a support onto the support rotation mechanism and evaporating the phosphor material, while rotating the support.

In the following, there will be detailed constituent features of the invention and preferred embodiments of the invention.
Constitution of Radiation Image Conversion Panel:

The radiation image conversion panel of the invention is featured in comprising a phosphor layer on a support which includes phosphor columnar crystals composed mainly of cesium iodide (CsI) and formed by a process of gas phase deposition. In addition to the phosphor layer, there are preferably provided various functional layers, as described later.

In one embodiment of the radiation image conversion panel of the invention, a scintillator panel which is provided, on the first substrate, with a phosphor layer formed via a process of gas phase deposition through a functional layer such as a reflection layer is adhered to or placed in contact with a photoelectric conversion panel provided with a photoelectric conversion element section in which picture elements comprised of a photosensor and TFT (Thin Film Transistor) or CCD (Charge Coupled Device) are two-dimensionally arranged on the second substrate to form a radiation image conversion panel; in another embodiment thereof, a planar light receiving element is formed on the substrate and further thereon, a phosphor layer is provided by a process of gas phase deposition directly or through a functional layer such as a reflection layer or a protective layer.

In the following, there will be exemplarily described component layers and component elements to form a scintillator panel but the case of a scintillator panel in which a planar light receiving element is formed on the substrate and further thereon, a phosphor layer is provided directly.
Phosphor Layer (Scintillator Layer):

The phosphor layer (also denoted as a scintillator layer) related to the invention is a phosphor layer including phosphor columnar crystals which are mainly composed of cesium iodide (CsI). A material to form a scintillator layer may employ a variety of commonly known phosphor materials, of which cesium iodide (CsI) is employed as a main component in the invention, since it exhibits an enhanced conversion rate of X-rays to visible light and readily forms a columnar crystal structure of a phosphor, whereby scattering of emitted light within the crystal is inhibited through the light guiding effect, rendering it feasible to increase the scintillator layer thickness.

CsI exhibits by itself a relatively low emission efficiency so that various activators are incorporated. For example, JP-B No. 54-35060 disclosed a mixture of CsI and sodium iodide (NaI) at any mixing ratio. Further, JP-A No. 2001-59899 disclosed vapor deposition of CsI containing an activator, such as thallium (Tl), europium (Eu), indium (In), lithium (Li), potassium (K), rubidium (Ru) or sodium (Na). In the present invention, thallium (Tl) or europium (Eu) is preferred, of which thallium (Tl) is more preferred.

In the present invention, it is preferred to employ, as raw materials, cesium iodide and an additive containing at least one thallium compound. Namely, thallium-activated cesium iodide (denoted as CsI:Tl), which exhibits a broad emission within the wavelength region of from 400 to 750 nm, is preferred.

There can be employed various thallium compounds (compound having an oxidation number of +I or +III) as a thallium compound contained in such an additive.

Preferred examples of thallium compounds include thallium bromide (TlBr), thallium chloride (TlCl), and thallium fluoride (TlF).

The melting point of a thallium compound relating to the present invention is preferably in the range of 400 to 700° C. A melting point higher than 700° C. results in inhomogeneous inclusions of an additive within the columnar crystal. In the present invention, the melting point is one under ordinary temperature and ordinary pressure.

In the scintillator layer of the present invention, the content of an additive, as described above is desirably optimized in accordance with its object or performance but is preferably from 0.001 to 50.0 mol % of cesium iodide, and more preferably from 0.1 to 10.0 mol %.

An additive content of less than 0.001 mol % of cesium iodide results in an emission luminance which is at an almost identical level to the emission luminance obtained by cesium iodide alone. An additive content of more than 50 mol % makes it difficult to maintain the properties or functions of cesium iodide.

The thickness of the phosphor layer (scintillator layer) is preferably 100 to 800 μm and more preferably 120 to 700 μm to achieve balanced characteristics of luminance and sharpness.

The phosphor columnar crystals related to the invention need to be formed by a process of gas phase deposition. The process of gas phase deposition may employ a vapor deposition method, a sputtering method, a CVD method, an ion plating method and the like, and the vapor deposition method is preferred in the invention.

The phosphor layer related to the invention is a phosphor layer comprising phosphor columnar crystals formed by the process of gas phase deposition, in which the coefficient of variation of the crystal diameters of the phosphor columnar crystals is not more than 50% and the coefficient of variation of the phosphor filling factors of the phosphor layer is not more than 20%.

Namely, the coefficient of variation of crystal diameter of the phosphor columnar crystals needs to be not more than 50%, preferably not more than 40%, more preferably not more than 30%, still more preferably not more than 20%, and further still more preferably not more than 10% to achieve advantageous effects of the invention. The coefficient of variation of phosphor filling factor of the phosphor layer needs to be not more than 20%, preferably not more than 15%, more preferably not more than 10%, and still more preferably not more than 5%.

In the invention, the coefficient of variation of crystal diameter of the phosphor columnar crystals is determined in the manner as follows. From an electron-micrograph including at least 100 columnar crystals in the visual field of the obtained phosphor layer, the individual crystal diameters are measured to calculate a standard deviation of crystal diameter. The thus calculated standard deviation is divided by an average crystal diameter of the at least 100 columnar crystals and the coefficient of variation of crystal diameter is determined in accordance with the following equation:

Coefficient of variation=[(standard deviation of crystal diameter)/(average crystal diameter)]×100.

On the other hand, the coefficient of variation of phosphor filling factor of the phosphor layer is determined in the following manner. The phosphor layer of an obtained scintillator panel is divided into 100 pieces. The filling factor of an individual piece is calculated by dividing the real mass of the phosphor layer by a theoretical density and an apparent volume, from which a standard deviation of filling factor is calculated. The thus calculated standard deviation is divided by the average filling factor of 100 pieces, whereby a coefficient of variation of filling factor is determined in accordance with the following equation:

Coefficient of variation=[(standard deviation of filling factor)/(average filling factor)]×100.

In the invention, the coefficient of variation of crystal diameter and the coefficient of variation of phosphor filling factor are controlled by controlling evaporation conditions (such as vacuum degree, temperature, distance between support and evaporation source, rotation rate of support, or the like). It is specifically preferred to control the distance between support and evaporation source and the rotation rate of the support to appropriate conditions in accordance with physicochemical properties of the phosphor material.

In the invention, it is preferred that phosphor columnar crystals contain cesium iodide (CsI) as a main component and the phosphor columnar crystals are formed from raw material including cesium iodide and a thallium-containing additive.

Further, it is also preferred that the phosphor columnar crystals related to the invention each comprise a layer not containing thallium in their bottom portions. Such crystals can be prepared basically in the following manner. Namely, for instance, only CsI is deposited on a support to form a phosphor (CsI) crystals until the intended thickness is reached and on the formed crystals, cesium iodide and an additive containing thallium (for example, CsI:0.003Tl) are deposited (gas phase deposition) until the desired thickness is reached, whereby a phosphor columnar crystals (phosphor layer) is formed.

In the invention, "bottom portion" refers to an initially formed portion in the process of forming phosphor columnar crystals through gas phase deposition. Further, "layer not containing thallium" refers to a crystal portion containing substantially no thallium in the phosphor columnar crystals which are formed in the foregoing manner.

Reflection Layer:

In the invention, it is preferred to provide a reflection layer (also denoted as a metal reflection layer) on the support (substrate). Light emitted from a phosphor (scintillator) is reflected, resulting in enhanced light-extraction efficiency. The reflection layer is preferably formed of a material containing an element selected from the group consisting of Al, Ag, Cr, Cu, Ni, Ti, Mg, Rh, Pt, and Au.

It is specifically preferred to employ a metal thin-film composed of the foregoing elements, for example, Ag film or Al film. Such a metal film may be formed of two or more layers. When a metal film is formed to two or more layers, the lower layer preferably is a layer containing Cr, whereby enhanced adhesion to the substrate is achieved. A layer comprised of a metal oxide such as $SiO_2$ or $TiO_2$ may be provided on the metal thin-film to achieve enhanced reflectance.

The thickness of a reflection layer is preferably 0.005 to 0.3 μm in terms of emission-extraction efficiency, and more preferably 0.01 to 0.2 μm.

The reflection layer related to the invention may be formed by any method known in the art, including, for example, a sputtering treatment by use of the foregoing raw material.

Metal Protective Layer:

The scintillator panel related to the invention may be provided, on the foregoing reflection layer, with a protective layer to protect the metal reflection layer.

Such a metal protective layer is formed preferably by coating a resin dissolved in a solvent and drying it. A polymer exhibiting a glass transition point of 30 to 100° C. is preferred in terms of adhesion of deposited crystals to a support (substrate) and specific examples of such a polymer include a polyurethane, vinyl chloride copolymer, poly[(vinyl chloride)-co-(vinyl acetate)], poly[(vinyl chloride)-co-(vinylidene chloride)], poly[(vinyl chloride)-co-acrylonitrile], poly(butadiene-co-acrylonitrile), polyvinyl acetal, polyester, cellulose derivatives (e.g., nitrocellulose), polyimide, polyamide, poly-p-xylylene, poly(styrene-co-butadiene), various synthetic rubber resins, phenol resin, epoxy resin, urea resin, melamine resin, phenoxy resin, silicone resin, acryl resin and urea formamide resin. Of these, a polyester resin is preferred.

The thickness of a metal protective layer is preferably not less than 0.1 μm in terms of adhesive property and not more than 3.0 μm to achieve smoothness of the metal protective layer surface, and more preferably is in the range of 0.2 to 2.5 μm.

Examples of a solvent used for the protective layer include a lower alcohol such as methanol, ethanol, n-propanol or n-butanol; a chlorine-containing hydrocarbon such as methylene chloride or ethylene chloride; a ketone such as acetone, methyl ethyl ketone or methyl isobutyl ketone; an aromatic compound such as toluene, benzene, cyclohexane, cyclohexanone or xylene; an ester of a lower carboxylic acid and a lower alcohol, such as methyl acetate, ethyl acetate or butyl acetate; an ether such as dioxane, ethylene glycol monoethyl ester, or ethylene glycol monomethyl ester; and an ether such as dioxane, ethylene glycol monoethyl ester, or ethylene glycol monomethyl ester.

Sublayer:

In the invention, it is preferred in terms of adhesion to provide a sublayer between the support (substrate) and the phosphor layer, or between a reflection layer and a phosphor layer. Such a sublayer preferably contains a polymeric binder (binder), a dispersing agent or the like. The thickness of a sublayer is preferably from 0.5 to 4 μm. A thickness of more than 4 μm results in increased light scattering in the sublayer, leading to deterioration in sharpness. A thickness of less than 0.5 μm results in disorder of columnar crystallinity, due to the heat treatment. There will be further described constituents of a sublayer.

Polymeric Binder:

The sublayer related to the invention is formed preferably by coating a polymeric binder (hereinafter, also denoted simply as a binder) dissolved or dispersed in a solvent, followed by drying. Specific examples of such a polymeric binder include a polyurethane, vinyl chloride copolymer, poly[(vinyl chloride)-co-(vinyl acetate)], poly[(vinyl chloride)-co-(vinylidene chloride)], poly[(vinyl chloride)-co-acrylonitrile], poly(butadiene-co-acrylonitrile), polyvinyl acetal, polyester, cellulose derivatives (e.g., nitrocellulose), polyimide, polyamide, poly-p-xylylene, poly(styrene-co-butadiene), various synthetic rubber resins, phenol resin, epoxy resin, urea resin, melamine resin, phenoxy resin, silicone resin, acryl resin and urea formamide resin. Of these, it is preferred to employ a polyester, a vinyl chloride copolymer, polyvinyl butyral or nitrocellulose.

The polymeric binder related to the invention preferably is a polyester, a vinyl chloride copolymer, polyvinyl butyral or nitrocellulose, in terms of adhesion. A polyester resin is specifically preferred.

Examples of a solvent for use in preparation of a sublayer include a lower alcohol such as methanol, ethanol, n-propanol or n-butanol; a chlorine-containing hydrocarbon such as methylene chloride or ethylene chloride; a ketone such as acetone, methyl ethyl ketone or methyl isobutyl ketone; an aromatic compound such as toluene, benzene, cyclohexane, cyclohexanone or xylene; an ester of a lower carboxylic acid and a lower alcohol, such as methyl acetate, ethyl acetate or butyl acetate; an ether such as dioxane, ethylene glycol monoethyl ester, or ethylene glycol monomethyl ester; and an ether such as dioxane, ethylene glycol monoethyl ester, or ethylene glycol monomethyl ester.

The sublayer related to the invention may contain a pigment of a dye to inhibit scattering of light emitted from a phosphor (scintillator) to achieve enhanced sharpness.

Protective Layer:

A protective layer related to the invention mainly aims to protect a scintillator layer. Namely, cesium iodide (CsI) is a hygroscopic material, and absorbs moisture from the atmosphere to deliquesce so that it is a main aim to inhibit this.

The moisture-resistant protective layer can be formed by use of various materials. For instance, it is to form a p-xylylene membrane by a CVD process. Namely, it is to form a p-xylylene layer on all of the surfaces of a scintillator and a substrate, where a protective layer is formed.

Alternatively, a polymer film, as a protective layer, may be provided on the phosphor layer. A material of such a polymer film may employ a film similar to a polymer film as a support (substrate) material, as described later.

The thickness of a polymer film is preferably not less than 12 μm and not more than 120 μm, and more preferably not less than 20 μm and not more than 80 μm, taking into account formability of void portions, protectiveness of a phosphor layer, sharpness, moisture resistance and workability. Taking into account sharpness, uniformity of radiation image, production stability and workability, the haze factor is preferably not less than 3% and not more than 40%, and more preferably not less than 3% and not more than 10%. The haze factor is determined by using, for example, NDH 500W, made by Nippon Denshoku Kogyo Co., Ltd. Such a haze factor can be achieved by choosing commercially available polymer films.

Taking into account photoelectric conversion efficiency and scintillator emission wavelength, the light transmittance of the protective film is preferably not less than 70% at 550 nm; however, a film with light transmittance of 99% or more is not commercially available, so that it is substantially preferred to be from 70 to 99%.

Taking into account protectiveness and deliquescence of a scintillator layer, the moisture permeability of the protective film is preferably not more than 50 $g/m^2 \cdot day$ (40° C., 90% RH, measured in accordance with JIS Z 0208) and more preferably not more than 10 $g/m^2 \cdot day$ (40° C., 90% RH, measured in accordance with JIS Z 0208); however, a film of not more than 0.01 g/m²·day (40° C., 90% RH) is not commercially available, so that it is substantially preferred to be not less than 0.01 g/m²·day (40° C., 90% RH) and not more than 50 g/m²·day (40° C., 90% RH, measured in accordance with JIS Z 0208), and it is more preferred to be not less than 0.1 g/m²·day (40° C., 90% RH) and not more than 10 g/m²·day (40° C., 90% RH, measured in accordance with JIS Z 0208).

Support (Substrate):

In the invention, a support (also denoted as a substrate) preferably is a quartz glass sheet, a metal sheet such as aluminum, iron, tin or chromium, a carbon fiber-reinforced sheet, or a polymer film.

There are usable polymer films (plastic films) such as cellulose acetate film, polyester film, polyethylene terephthalate film, polyamide film, polyimide film, triacetate film, polycarbonate film and carbon fiber reinforced resin. A polymer film containing a polyimide or polyethylene naphthalate is specifically suitable when forming phosphor columnar crystals with a raw material of cesium iodide by a process of gas phase deposition.

The support (substrate) related to the invention preferably is a 50-500 μm thick, flexible polymer film.

Herein, the flexible support (substrate) refers to a substrate exhibiting an elastic modulus at 120° C. (also denoted as E120) of 1000 to 6000 N/mm². Such a substrate preferably is a polymer film containing polyimide or polyethylene terephthalate.

In the region showing a linear relationship between strain and corresponding stress which is measured by using a tensile strength tester based on JIS C 2318, the elastic modulus is calculated as the slope of the straight portion of the stress-strain curve, that is, a strain divided by a stress. It is also referred to as a Young's modulus. In the invention, such a Young's modulus is also defined as the elastic modulus.

The substrate used in the invention preferably exhibits an elastic modulus at 120° C. (E120) of 1000 to 6000 N/mm², and more preferably 1200 to 5000 N/mm².

Specific examples include polymer film comprised of polyethylene naphthalate (E120=4100 N/mm²), polyethylene terephthalate (E120=1500 N/mm²), polybutylene naphthalate (E120=1600 N/mm²), polycarbonate (E120=1700 N/mm²), syndiotactic polystyrene (E120=2200 N/mm²), polyether imide (E120=1900 N/mm²), polyacrylate (E120=1700 N/mm²), polysulfone (E120=1800 N/mm²) or polyether sulfone (E120=1700 N/mm²).

These may be used singly or mixedly, or laminated. Of these polymer films, a polymer film comprising polyimide or polyethylene naphthalate is preferred.

Adhesion of the scintillator panel to the surface of a planar light receiving element is often affected by deformation or warpage of the support (substrate) during deposition, rendering it difficult to achieve a uniform image quality characteristic within the light receiving surface of a flat panel detector. In such a case, a 50-500 μm thick polymer film is used as the support (substrate), whereby the scintillator panel is deformed with being fitted to the form of the surface of a planar light receiving element, leading to uniform sharpness over all of the light-receiving surface of the flat panel detector.

The support may be provided with a resin layer to make the surface smooth. The resin layer preferably contains a compound such as a polyimide, polyethylene terephthalate, paraffin or graphite, and the thickness thereof preferably is approximately 5 to 50 μm. The resin layer may be provided on the front surface or back surface of the support.

Means for providing an adhesion layer on the support surface include, for example, a pasting method and a coating method. Of these, the pasting method is conducted by using heat or a pressure roller preferably in the heating condition of approximately 80 to 150° C., a pressure condition of 4.90×10 to 2.94×10² N/cm and a conveyance rate of 0.1 to 2.0 m/sec.

Production Method of Scintillator Panel:

A production method of the scintillator panel related to the invention is preferably one in which, using an evaporation device having an evaporation source and a support rotation mechanism provided within a vacuum vessel, a support is placed on the rotation mechanism and a phosphor layer is formed by a gas phase deposition process of evaporating a phosphor material, while rotating the support rotation mechanism.

In the following, there will be described the embodiments of the invention with reference to FIG. 1.

Production Device of a Scintillator Panel:

FIG. 1 illustrates a schematic constitution of a production device of a scintillator panel related to the invention. As illustrated in FIG. 1, a vapor production device 1 of a radiation scintillator is provided with a vacuum vessel 2. The vacuum vessel 62 is provided with a vacuum pump 3 to evacuate the inside of the vacuum vessel 2 and to introduce atmosphere.

A support holder 5 to hold a support 4 is provided near the topside within the vacuum vessel 2.

A phosphor layer is formed on the surface of the support 4 by a process of gas phase deposition. The process of gas phase deposition may employ a vapor deposition method, a sputtering method, a CVD method, an ion-plating method or the like, of which the vapor deposition method is preferred in the invention.

A holder 5 supports the substrate 1 so that the support surface to form the phosphor layer is opposed to and is also parallel to the bottom face of the vacuum vessel 2.

The support holder 5 is preferably provided with a heater (which is not shown in the drawing) to heat the support 4. Heating the substrate by the heater achieves enhanced contact of the substrate to the support holder 5 and controls layer quality of the phosphor layer. Further, adsorbate on the surface of the support 4 is also eliminated or removed to inhibit generation of an impurity layer between the surface of the support 4 and a phosphor described later.

Further, there may be provided, as a heating means, a mechanism (not shown in the drawing) to circulate a warming medium or heating medium. Such a means is suitable when performing vapor deposition with maintaining the support 4 at a relatively low temperature of 50 to 150° C.

There may be provided a halogen lamp (not shown in the drawing) as a heating means. This means is suitable when performing vapor deposition with maintaining the support 4 at a relatively high temperature of not less than 150° C.

The support holder 5 is provided with a rotation mechanism 6 to rotate the support 4 in the horizontal direction. The support rotation mechanism 6 is constituted of a support rotation shaft 7 to rotating the support 4 with supporting the support holder 5 and a motor (not shown in the drawing) which is disposed outside the vacuum vessel and is a driving source of the support rotation shaft 7.

In the vicinity of the bottom surface within the vacuum vessel 2, evaporation sources 8a and 8b are disposed at positions opposed to each other on the circumference of a circle centered on a center line vertical to the support 4. In that case, the distance between the support 4 and the evaporation source 8a or 8b is preferably from 100 to 1500 mm, and more preferably from 200 to 1000 mm. Further, the distance the center line vertical to the substrate 1 and the evaporation source 8a or 8b is preferably from 100 to 1500 mm, and more preferably from 200 to 1000 mm.

The radiation scintillator production device may be provided with three or more evaporation sources, in which the individual evaporation sources may be disposed at equivalent intervals or different intervals. The radius of a circle centered on a center line vertical to the support 4 can arbitrarily be set.

The evaporation sources 8a and 8b, which house a phosphor and heat it by a resistance heating method, may be constituted of an alumina crucible wound by a heater, a boat or a heater of a metal with a high melting point. Methods of heating a phosphor include heating by an electron beam and high-frequency induction heating, but in the invention, a method of resistance-heating by direct current or a method of resistance-heating indirectly a crucible by a circumferential heater is preferable in terms of ease of operation by a relatively simple constitution and low price and also being applicable to many substances. The evaporation sources 8a and 8b may be a molecular beam by a molecular source epitaxial method.

A shutter which is openable in the horizontal direction is provided between the evaporation source 8a or 8b) and the substrate 1 to intercept the space from the evaporation source 8a) or 8b to the support 4; this shutter prevents substances except the objective material which were attached to the phosphor surface and have been evaporated at the initial stage of vapor deposition from adhering onto the support 4.

Production Method of Scintillator Panel:

Next, there will be described a production method of a scintillator panel related to the invention by using the foregoing production device 1 of the foregoing scintillator panel.

First, the support 4 is placed onto the support holder 5. Further, evaporation sources 8a and 8b are disposed on the circumference of a circle centered on a center line vertical to the substrate 1 in the vicinity of the bottom of the vacuum vessel 2. In that case, the space between the substrate 1 and the evaporation source 8a) or 8b is preferably form 100 to 1500 mm, and more preferably from 200 to 1000 mm. The space between the center line vertical to the support 4 is preferably from 100 to 1500 mm, and more preferably from 200 to 1000 mm.

Subsequently, the inside of the vacuum vessel 2 is evacuated to control the evacuation degree to the desired level. Thereafter, the support holder 5 is rotated to the evaporation sources 8a and 8b by the rotation mechanism 6. When the vacuum vessel 2 reaches a vacuum degree capable of performing vapor deposition, phosphor is evaporated from the heated evaporation sources 8a and 8b, whereby the phosphor is grown to a desired thickness on the surface of the support 4.

The process of growing a phosphor on the surface of the support 4 may be divided to plural steps to form a phosphor layer.

In the vapor deposition method, a material subject to deposition (the support 4, protective layer or intermediate layer) may appropriately be heated or cooled during vapor deposition.

After completing vapor deposition, the phosphor layer may be subjected to a heating treatment. There may be also conducted a reactive deposition in which deposition is performed, while introducing gas such as $O_2$ or $H_2$.

The thickness of the formed phosphor layer, which is different depending on intended use or the kind of a phosphor, is from 50 to 2000 μm, preferably 50 to 1000 μm, and more preferably from 100 to 800 μm.

The temperature of the support 4 on which a phosphor layer is to be formed, is set preferably to the range of room temperature (rt) to 300° C., and more preferably 50 to 250° C.

After forming the phosphor layer, a protective layer to physically or chemically protect the phosphor layer may be provided on the phosphor layer opposite to the support 4. A coating solution for a protective layer may be directly coated onto the phosphor layer surface or a protective layer which was previously formed may be adhered to the phosphor layer. The thickness of such a protective layer is preferably from 0.1 μm to 2000 μm.

Alternatively, a protective layer may be formed by depositing an inorganic substance such as SiC, $SiO_2$, SiN or $Al_2O_3$ through a vapor deposition method, sputtering method or the like.

In the invention, there may be provided various functional layers other than the protective layer.

In the production device 1 for a scintillator panel or the production method thereof, plural evaporation sources 8a and 8b are provided, whereby the overlapping portion of vapor streams from evaporation sources 8a and 8b are straightened, resulting in uniform crystallinity of a phosphor deposited on the surface of the support 4. In that case, more evaporation sources are provided, vapor streams are straightened at a larger number of portions, resulting in uniform crystallinity over a broader region. Further, when evaporation sources 8a and 8b are disposed on the circumference of a circle centered on a center line vertical to the support 4, such an action of uniformalizing crystallinity by straightening vapor streams can be isotropically achieved on the surface of the support 4.

Further, performing deposition of a phosphor with rotating the support 4 by the support rotation mechanism 6 can achieve uniform deposition of the phosphor on the surface of the support 4.

In the production device 1 or the production method of the scintillator panel related to the invention, as described above, the phosphor layer is allowed to grow so that the crystallinity of the phosphor becomes uniform, thereby achieving enhanced sharpness in the radiation image obtained from the radiation image conversion panel by using the scintillator panel related to the invention.

Further, restriction of the incident angle of the foregoing phosphor to be deposited on the support 4 to the prescribed region to inhibit fluctuation in the incident angle of the phosphor results in uniformity crystallinity of the phosphor and enhanced sharpness of the obtained radiation image.

In the foregoing, there are described cases when the support holder 5 is provided with the support rotation mechanism 6, but the invention is not limited to these but is also applicable to those cases, including, for example, the case of performing evaporation, while the support holder 5 holding the support 4 at rest; and the case of depositing the phosphor from the evaporation source 8a or 8b, while the support 4 is in the horizontal direction to the evaporation source 8a or 8b.

Radiation Image Conversion Panel:

The radiation image conversion panel of the invention (also denoted as a radiation image detector or radiation flat panel detector) may be obtained by adhering or contacting a scintillator panel which is provided with a phosphor layer formed on the first substrate by the gas phase deposition process through a functional layer such as a reflection layer, to a photoelectric conversion panel provided, on the second substrate, with a photoelectric conversion element section (or planar light receiving element) in which picture elements comprised of a photosensor and a TFT (Thin Film Transistor) or CCD (Charge Coupled Device) are two-dimensionally arranged. Alternatively, it may be obtained by forming the photoelectric conversion element section in which picture elements comprised of a photosensor and a TFT or CCD are two-dimensionally arranged, followed by providing the phosphor layer by the process of gas phase deposition directly or through a functional layer such as a protective layer.

Namely, the radiation image conversion panel of the invention is required to be one which is provided, as a basic constitution, with a phosphor layer and a light-receiving element (hereinafter, also denoted as a planar light-receiving element) in which plural light-receiving elements are two-dimensionally arranged.

Accordingly, the planar light-receiving element converting emission from the phosphor layer to a charge makes it feasible to digitize the image data.

The surface mean roughness (Ra) of the planar light receiving element related to the invention is preferably within the range of 0.001 to 0.5 μm. Accordingly, it is preferred that after forming a light-receiving element on the glass surface, an organic resin film such as polyester of acryl is formed on the surface and the surface roughness is controlled by a photo-etching method so that the relevant requirements are met. The surface mean roughness (Ra) of the planar light receiving element related to the invention is preferably 0.001 to 0.1 μm, and more preferably 0.001 to 0.05 μm.

The radiation image conversion panel of the invention is preferably in the form of a scintillator panel being contactably pressed to a planar light-receiving element by an elastic member (such as a sponge, spring or the like). It is also a preferred embodiment that the scintillator panel is brought into contact with the planar light-receiving element by evacuating the space between the scintillator panel and the planar light-receiving element and the circumference is sealed with an adhesive sealing member. Such an adhesive sealing member preferably is an ultraviolet-curable resin.

It is also a preferred embodiment that the scintillator panel is provided with a phosphor layer and the phosphor layer is directly in contact with a planar light-receiving element.

Such ultraviolet-curable resins are not specifically restricted but can be selected appropriately from those known in the art. These ultraviolet-curable resins contain a photopolymerizable prepolymer or photopolymerizable monomer and a photopolymerization initiator or a photosensitizer.

Examples of such a photopolymerizable prepolymer include a polyester-acrylate one, an epoxy-acrylate one, a urethane acrylate one and a polyol-acrylate one. These photopolymerizable pre-polymers may be used singly or in combination. Examples of a photopolymerizable monomer include polymethylolpropane tri(meth)acrylate, hexanediol (meth)acrylate, tripropylene glycol di(meth)acrylate, diethylene glycol di(meth)acrylate, pentaerythritol tri(meth)acrylate, dipentaerythriltol hexa(meth)acrylate, 1,6-hexanediol di(meth)acrylate, and neopentyl glycol di(meth)acrylate.

In the invention, there are preferably used a urethane acrylate prepolymer and a dipentaerythritol hexa(meth)acrylate monomer.

Examples of a photopolymerization initiator include acetophenones, benzophenones, α-amyloxime ester, tetramethyl thiuram monosulfide, and thioxanthones. Further, n-butylamine, triethylamine and poly-n-butylphosphine are mixedly used as a photosensitizer.

EXAMPLES

The present invention will be further described with reference to examples but the invention is by no means limited to these.

Using the production apparatus shown in FIG. 1, a scintillator pane 1 was prepared in the manner below.

Example 1

Preparation of Scintillator Panel

Phosphor 1 (CsI alone) and phosphor 2 (CsI:0.003Tl) were vapor-deposited, on one side of a support comprised of a polyimide resin sheet, to form a phosphor layer. Specifically, first, a support is placed on a support holder provided with a support rotation mechanism. Then, the foregoing phosphor raw materials were placed in evaporation source crucibles. Two evaporation source crucibles were disposed in the vicinity of the bottom of the vacuum vessel and on the circumference of a circle centered on a center line vertical to the support. The distance between the support and the evaporation source was adjusted to 300 mm and the distance between the center line vertical to the support and the evaporation source was adjusted to 300 mm. Subsequently, after the interior of the vacuum vessel was evacuated, the vacuum degree was adjusted to 0.1 Pa, while introducing Ar gas and the temperature of the support was maintained at 30° C., while rotating the support at a rate of 10 rpm. Subsequently, the interior of the crucible was raised to a prescribed temperature by resistance heating. Subsequently, evaporation of the phosphor 1 was initiated without rotating the support and then, the temperature of the support (substrate) was raised to 200° C. When the thickness of a phosphor layer reached 30 μm, evaporation was terminated. Subsequently, the phosphor 2 was evaporated and when the thickness of the phosphor layer reached 450 μm, evaporation was completed.

Subsequently, the phosphor layer was placed into a protective layer bag in an atmosphere of dry air to obtain a scintillator panel with a structure of the phosphor layer being sealed.

Example 2

A scintillator panel was obtained in the same manner as in Example 1, except that the distance between the support and the evaporation source was adjusted to 500 mm.

Example 3

A scintillator panel was obtained in the same manner as in Example 1, except that the distance between the support and the evaporation source was adjusted to 700 mm.

Example 4

A scintillator panel was obtained in the same manner as in Example 1, except that the distance between the support and the evaporation source was adjusted to 900 mm.

Example 5

A scintillator panel was obtained in the same manner as in Example 1, except that the distance between the support and the evaporation source was adjusted to 1000 mm.

Comparison 1

A scintillator panel was obtained in the same manner as in Example 1, except that evaporation was conducted without rotating the support.

Comparison 2

A scintillator panel was obtained in the same manner as in Comparative Example 1, except that the distance between the support and the evaporation source was adjusted to 1000 mm.

The thus obtained scintillator panels were each evaluated as follows.

Coefficient of Variation of Crystal Diameter of Columnar Crystals:

From an electron-micrograph including at least 100 columnar crystals in the visual field of the phosphor layer of the obtained scintillator panel, the individual crystal diameters were determined, from which a standard deviation of crystal diameter was calculated. The thus calculated standard deviation was divided by an average crystal diameter of at least 100 columnar crystals and the coefficient of variation of crystal diameter was determined in accordance with the following equation:

Coefficient of variation=[(standard deviation of crystal diameter)/(average crystal diameter)]×100.

Coefficient of Variation of Phosphor Filling Factor:

The phosphor layer of the obtained scintillator panel was divided into 100 pieces. With respect to the individual piece, a filling factor was calculated by dividing the real mass of the phosphor layer by a theoretical density and an apparent volume, from which the standard deviation of filling factors was determined. Further, the thus determined standard deviation of filling factors was divided by the average filling factor of 100 pieces and a coefficient of variation of filling factors was determined in accordance with the following equation:

Coefficient of variation=[(standard deviation of filling factor)/(average filling factor)]×100.

Sharpness:
Evaluation of Sharpness:

The obtained scintillator panels, each was set to Pax Scan (FPD:250, made by Varian) and the average value of sharpness over the whole surface was evaluated in the manner below. The results thereof are shown in Table 1.

The FPD was exposed to X-rays at a tube voltage of 70 kVp through a lead MTF chart and the image data was recorded on a hard disc. Then, the record on the hard disc was analyzed by a computer to determine a modulation transfer function, MTF [MTF value (%) at a spatial frequency cycle of 1/mm], which was a measure of sharpness. The obtained MTF was represented by a relative value, based on the MTF of the radiation conversion panel of Comparison 1 being 100. A higher MTF value indicates superior sharpness. "MTF" is the abbreviation for Modulation Transfer Function.

Then, an MTF was measured with respect to arbitrary ten portions within the phosphor layer surface and from their maximum value (MAX) and minimum value (MIN), the MTF distribution was calculated in accordance with the following equation:

MTF distribution={(MAX−MIN)/[(MAX+MIN)×2]}×100(%)

Evaluation of Moisture Resistance:

The obtained scintillator panels were allowed to stand in an environment of 70° C. and 90% RH and the deteriorated moisture resistance was represented by a relative value, based on the value before being allowed to stand being 100.

Results obtained from the foregoing evaluation are shown in Table 1.

The obtained radiation scintillators were each set into a Pax Scan 2520 (FPD, made by Varian Co.) to prepare a radiation image conversion panel (detector: radiation image detector). After a 500 g iron ball was allowed to fall onto a radiation image detector from a height of 20 cm, the radiation image detector was visually observed and evaluated. Thereafter, after being exposed to X-rays at a tube voltage of 80 kVp, an obtained image on a flat panel detector (FDP) was printed out by an output device and the obtained print image was visually evaluated with respect to shock resistance, based on the following criteria. Evaluation results are shown in Table 1. Evaluation was made for every 0.5 rank.

5: No cracking was observed and a uniform image was obtained,

4: No cracking was observed and image quality was at a level of being barely noticed, 3: Cracking was observed and slight image defects were confirmed, which was still at a level of being acceptable in practice, 2: Cracking was observed and an apparent image defect was confirmed 1: A large number of cracks was observed and many image defects were noted, which were at a level to cause problems in practice.

TABLE 1

| | Support | Distance between Support and Evaporation Source (mm) | Coefficient of Variation of Crystal Diameter (%) | Coefficient of Variation of Phosphor Filling Ratio (%) | MTF | MTF Distribution (%) | Moisture Resistance | Shock Resistance |
|---|---|---|---|---|---|---|---|---|
| Comparison 1 | without rotation | 300 | 65 | 25 | 100 | 55 | 50 | 1.0 |
| Comparison 2 | without rotation | 900 | 57 | 22 | 105 | 46 | 67 | 2.0 |
| Example 1 | with rotation | 300 | 49 | 18 | 102 | 37 | 81 | 3.0 |
| Example 2 | with rotation | 500 | 38 | 15 | 110 | 25 | 85 | 3.5 |
| Example 3 | with rotation | 700 | 27 | 9 | 121 | 23 | 90 | 4.0 |
| Example 4 | with rotation | 900 | 14 | 6 | 125 | 20 | 97 | 4.5 |
| Example 5 | with rotation | 1000 | 9 | 3 | 130 | 15 | 98 | 5.0 |

As is apparent from the results shown in Table 1, the radiation image conversion panels of the invention in which the coefficient of variation of columnar crystal diameter is not more than 50% and the coefficient of variation of phosphor filling factor is not more than 20% exhibit an improved MTF distribution and enhanced relative MTF value. Specifically, as the coefficient of variation decreases, such a tendency is markedly apparent.

On the contrary, conventional scintillator panels (Comparison 1-2) in which the coefficient of variation of columnar crystal diameter is more than 50% and the coefficient of variation of phosphor filling factor is more than 20%, exhibit a deteriorated MTF distribution and a lowered relative MTF value. As can be seen therefrom, it was proved that the coefficient of variation of columnar crystal diameter is preferably not more than 50%, more preferably not more than 40%, still more preferably not more than 30%, further still more preferably not more than 20%, and most preferably not more than 10%. It was also proved that the coefficient of variation of phosphor filling factor is preferably not more than 20%, more preferably not more than 15%, still more preferably not more than 10%, and further still more preferably not more than 5%.

It was further proved that, with respect to moisture resistance and shock resistance, magnitude of deterioration decreases as the coefficient of variation decreases, and apparently leading to an improvement.

What is claimed is:

1. A radiation image conversion panel comprising, on a support, a phosphor layer comprising phosphor columnar crystals, each containing cesium iodide (CsI) and formed by a process of gas phase deposition, wherein a coefficient of variation of crystal diameter of the phosphor columnar crystals is not more than 50% and a coefficient of variation of phosphor filling factor of the phosphor layer is not more than 20%.

2. The radiation image conversion panel as claimed in claim 1, wherein the phosphor columnar crystals are formed of raw materials of cesium iodide (CsI) and an additive containing a thallium (Tl) compound.

3. The radiation image conversion panel as claimed in claim 1, wherein the phosphor columnar crystals comprise a layer not containing thallium in bottom portions of the columnar crystals.

4. The radiation image conversion panel as claimed in claim 1, wherein the radiation image conversion panel is provided with a scintillator panel comprising the phosphor layer on the support and a light receiving element (planar light receiving element) having plural light receiving picture elements which are two-dimensionally arranged.

5. A production method of a radiation image conversion panel comprising, on a support, a phosphor layer comprising phosphor columnar crystals, each containing cesium iodide (CsI), by using a vapor deposition device having an evaporation source and a support rotation mechanism provided within a vacuum vessel, a phosphor layer is formed by a gas phase deposition process comprising the steps of:

(a) placing a support onto the support rotation mechanism, and (b) evaporating a phosphor material with rotating the support to form a phosphor layer on the support, wherein a coefficient of variation of crystal diameter of the phosphor columnar crystals is not more than 50% and a coefficient of variation of phosphor filling factor of the phosphor layer is not more than 20%.

6. The method as claimed in claim 5, wherein the phosphor material comprises cesium iodide (CsI) and an additive containing a thallium (Tl) compound.

7. The method as claimed in claim 5, wherein the phosphor columnar crystals comprise a layer not containing thallium in bottom portions of the columnar crystals.

8. The method as claimed in claim 7, wherein the step (b) comprises (b1) evaporating cesium iodide (CsI) to form a layer of columnar crystals comprised of cesium iodide (CsI) on the support, and then (b2) evaporation cesium iodide (CsI) and an additive containing a thallium compound to form a layer of columnar crystals mainly composed of cesium iodide and containing thallium on the columnar crystals comprised of cesium iodide (CsI) formed on the support.

\* \* \* \* \*